United States Patent
Holm et al.

(10) Patent No.: US 9,857,435 B2
(45) Date of Patent: Jan. 2, 2018

(54) CORRUPTION DETECTION AND SMART RESET OF FERROMAGNETIC STRUCTURES IN MAGNETIC FIELD SENSORS

(71) Applicant: FREESCALE SEMICONDUCTOR, INC., Austin, TX (US)

(72) Inventors: Paige M. Holm, Phoenix, AZ (US); Lianjun Liu, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 268 days.

(21) Appl. No.: 14/710,102

(22) Filed: May 12, 2015

(65) Prior Publication Data

US 2016/0334472 A1 Nov. 17, 2016

(51) Int. Cl.
*G01R 33/02* (2006.01)
*G01R 33/00* (2006.01)
*G01R 33/09* (2006.01)

(52) U.S. Cl.
CPC ...... *G01R 33/0023* (2013.01); *G01R 33/0011* (2013.01); *G01R 33/0017* (2013.01); *G01R 33/0035* (2013.01); *G01R 33/09* (2013.01)

(58) Field of Classification Search
CPC ............................ G01R 33/098; G01R 33/0035
USPC ......................................... 324/244, 202, 255
See application file for complete search history.

(56) References Cited

U.S. PATENT DOCUMENTS

| | | | |
|---|---|---|---|
| 5,351,005 A | 9/1994 | Rouse et al. | |
| 8,447,556 B2 | 5/2013 | Friedrich et al. | |
| 2004/0207400 A1 | 10/2004 | Witcraft et al. | |
| 2007/0217084 A1* | 9/2007 | Xue | G11B 5/3903 360/324.12 |
| 2011/0074406 A1 | 3/2011 | Mather et al. | |
| 2012/0293164 A1 | 11/2012 | Liou et al. | |
| 2013/0106410 A1 | 5/2013 | Liu et al. | |
| 2013/0138372 A1* | 5/2013 | Ausserlechner | G01R 15/207 702/65 |
| 2013/0221949 A1 | 8/2013 | Liu et al. | |

OTHER PUBLICATIONS

Bosch Sensortec, "Data Sheet BMM150 Geomagnetic Sensor", Apr. 25, 2013, pp. 1-56.

(Continued)

*Primary Examiner* — Reena Aurora
(74) *Attorney, Agent, or Firm* — Charlene R. Jacobsen

(57) ABSTRACT

A sensor package includes a magnetic field sensor and a corruption detection and reset subsystem. The magnetic field sensor has a magnetic sense element and a ferromagnetic structure characterized by a baseline magnetic state. The subsystem includes a detector element, a processor, and current carrying structure positioned in proximity to the ferromagnetic structure. Methodology performed by the subsystem entails detecting at the detector element an altered magnetic state of the ferromagnetic structure, where the altered magnetic state differs from the baseline magnetic state. Methodology further entails determining, at the processor, when a reset action is needed in response to the altered magnetic state and applying a reset magnetic field to the ferromagnetic structure to reset the ferromagnetic structure from the altered magnetic state to the baseline magnetic state.

19 Claims, 9 Drawing Sheets

(56) References Cited

OTHER PUBLICATIONS

Robert Racz et al, "Electronic Compass Sensor", Institute of Electrical and Electronics Engineers (IEEE), 2004, pp. 1446-1449, Switzerland.

U.S. Appl. No. 14/160,100, "Apparatus and Method for Reconditioning Z-axis Sensor Flux Guides", filed Jan. 21, 2014.

* cited by examiner

PRIOR ART

CORRUPTION DETECTION AND SMART RESET OF FERROMAGNETIC STRUCTURES IN MAGNETIC FIELD SENSORS

TECHNICAL FIELD OF THE INVENTION

The present invention relates generally to magnetoelectronic devices. More specifically, the present invention relates to corruption detection and smart reset of a ferromagnetic structure in a magnetic field sensor.

BACKGROUND OF THE INVENTION

Magnetic field sensors are widely used in a number of applications including in, for example, compass, security, and military applications, geophysics and space research, biomagnetism and medical applications, and non-destructive testing. Magnetic field sensors are typically based on semiconductor materials (e.g., Hall sensors, semiconductor magnetoresistors, and so forth) and ferromagnetic materials (e.g., ferromagnetic magnetoresistors, flux concentrators, flux guides, and the like). Other magnetic sensors utilize optical, resonant, and superconducting properties.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, the Figures are not necessarily drawn to scale, and:

DETAILED DESCRIPTION

In overview, embodiments of the present invention entail a magnetic field sensor package that includes a corruption detection and reset subsystem and methodology for detecting corruption of the magnetic state of a ferromagnetic structure and resetting the ferromagnetic structure to a baseline magnetic state. The corruption detection and reset subsystem ensures that the magnetic field sensor is "smart" in that it detects or otherwise anticipates a corrupting magnetic shock event directly and/or detects the effects of the magnetic shock event on the magnetization state of the ferromagnetic structures and/or detects the effects of the magnetic shock event on the output of the magnetic field sensor. The monitored data is analyzed within the subsystem to determine if and went to initiate a reset action. Accordingly, a reset action is applied when a reset is needed, as opposed to triggering periodically on a set schedule or tied to an external event, thereby achieving savings in power consumption.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements. These different elements may be produced utilizing current and upcoming fabrication techniques. Accordingly, although different shading and/or hatching is utilized in the illustrations, the different elements within the structural layers may be formed out of the same material.

Figure 1:
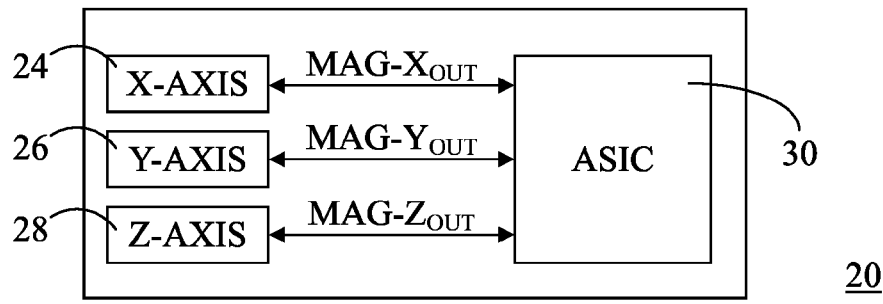
FIG. 1 shows a simplified block diagram of a prior art sensor package.

Referring to FIG. 1, FIG. 1 shows a simplified block diagram of a prior art sensor package 20. Sensor package 20 may be implemented in any device or system in which magnetic field sensing is required, for example, in electronic compass, security, and military applications, in geophysics and space research applications, in biomagnetism and medical applications, and/or in non-destructive testing. In this example, sensor package 20 may be adapted to sense a magnetic field along three axes. Hence, sensor package 20 includes an X-axis magnetic field sensor 24, a Y-axis magnetic field sensor 26, and a Z-axis magnetic field sensor 28. Magnetic field sensors 24, 26, 28 may be coupled to, or otherwise in communication with, an application specific integrated circuit (ASIC) 30 to form sensor package 20.

ASIC 30 performs some or all functions including, but not limited to, signal conditioning and data management, stabilization control, bridge/output multiplexing, self-test, electrostatic discharge (ESD) protection, and so forth.

There is a wide variety of magnetic field sensor technologies that have been implemented and made into products. Many of these magnetic field sensor technologies incorporate patterned ferromagnetic structures (generically referred to herein as "flux concentrators") for various purposes including shielding, flux concentrating, and flux redirecting. A flux concentrator is a ferrous material used to increase the performance of a magnetic field sensor.

Figure 2:
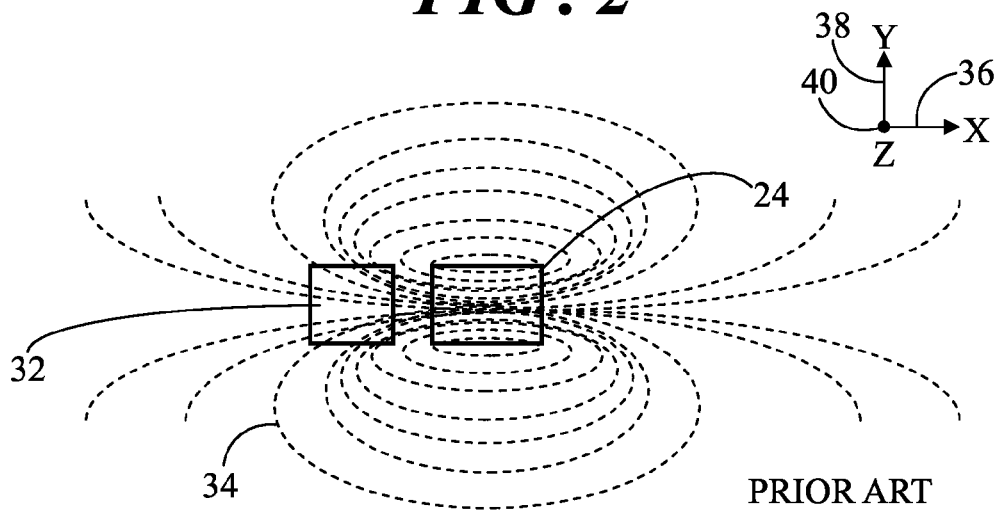
FIG. 2 shows a simplified view of a flux concentrator implemented with a magnetic field sensor.

FIG. 2 shows a simplified view of a ferromagnetic structure, in the form of a flux concentrator 32, implemented with a magnetic field sensor to sense the magnetic field in a direction parallel to the plane of a substrate, such as X-axis magnetic field sensor 24. When flux concentrator 32 is placed opposite a pole face of magnetic field sensor 24, an X-axis magnetic field 34 (represented by dashed lines) channels through flux concentrator 32, thereby increasing the magnetic flux density (i.e., the magnetic field) between flux concentrator 32 and the pole face of magnetic field sensor 24. In this side view illustration, an X-axis 36 is oriented right-and-left on the page, a Y-axis 38 is oriented up-and-down on the page, and a Z-axis 40 is represented as a dot that depicts an axis going either into or out of the page on which FIG. 2 is situated. Accordingly, the X-Y plane in this side view illustration is oriented right-and-left and up-and-down on the page.

Figure 3:
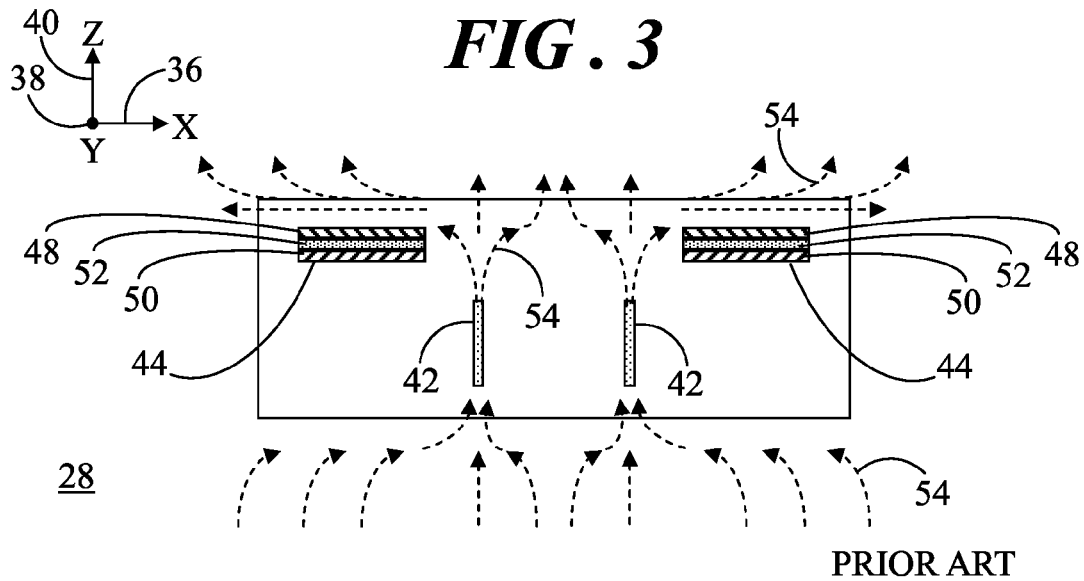
FIG. 3 shows a simplified side view of a flux guide for a Z-axis magnetic field sensor.

FIG. 3 shows a simplified side view of ferromagnetic structures, in the form of flux guides 42, implemented with a magnetic field sensor, such as Z-axis magnetic field sensor 28. In this simplified illustration, Z-axis magnetic field sensor 28 includes a pair of Z-axis sense elements 44 formed within a dielectric material, or substrate 46. Z-axis sense elements 44 may be magnetic tunnel junction (MTJ) structures, each of which includes ferromagnetic layers 48, 50 separated by an insulator layer 52. In this side view illustration, Z-axis 40 is oriented up-and-down on the page, X-axis 36 is oriented right-and-left on the page, and Y-axis 40 is represented as a dot that depicts an axis going either into or out of the page on which FIG. 2 is situated. Accordingly, the X-Y plane in this side view illustration is oriented right-and-left and into or out of the page.

In order to sense the magnetic field in a direction perpendicular to the plane of substrate 46, flux guides 42 are also formed within substrate 46. Flux guides 42 can be used to guide a Z-axis magnetic field 54 (represented by dashed arrows) into the X-Y plane. Thus, flux guides 42 are shaped ferromagnetic structures used to guide magnetic flux, i.e., Z-axis magnetic field 54, to a preferred location. With the use of flux guides 42 incorporated into Z-axis magnetic field sensor 28, Z-axis magnetic field 54 is suitably guided so that it can be sensed from in-plane sensing elements (i.e., Z-axis sense elements 44).

Figure 4:
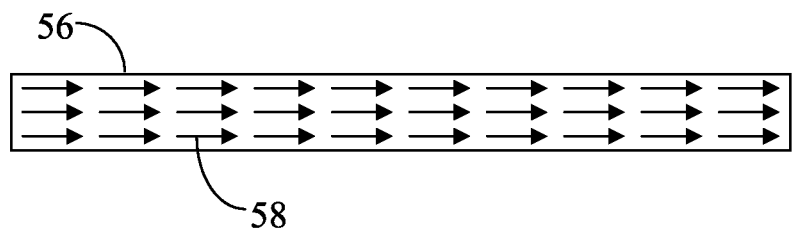
FIG. 4 shows a side view of a flux concentrator exemplifying a magnetic polarization having a baseline orientation.

FIG. 4 shows a side view of a ferromagnetic structure, generically referred to herein as a flux concentrator 56, exemplifying a magnetic polarization 58 (represented by rightwardly directed arrows) having a baseline, or stable, orientation. Thus, magnetic polarization 58 is referred to hereinafter as a baseline magnetic state 58 of flux concentrator 56. Flux concentrator 56 is used to generally represent flux concentrator 32 and flux guides 42. However, those skilled in the art will recognize that there are a wide variety of flux concentrator designs and functions. Hence, flux concentrator 56 is used herein to represent any ferromagnetic structure used in a magnetic field sensor to shield, concentrate, or guide a magnetic field.

For optimal response, flux concentrator 56 has a preferred magnetization orientation. That is, baseline magnetic state 58 for flux concentrator 56 will be directed in a uniform, i.e., generally single, direction. Unfortunately, ferromagnetic structures (e.g., flux concentrator 56) are susceptible to corruption by exposure to externally applied magnetic fields (e.g., disturbing fields of thirty Gauss or higher). This magnetic corruption can alter the magnetic state of flux concentrator 56 leading to unstable device characteristics including offset, axis alignment, and noise.

Figure 5:
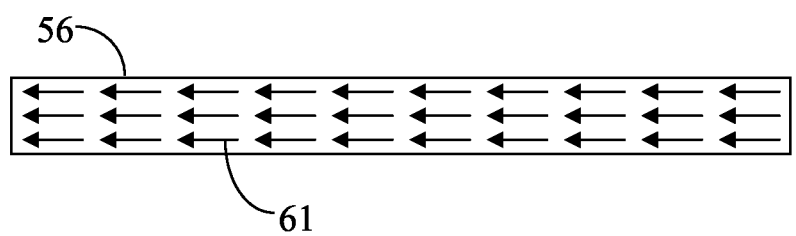
FIG. 5 shows a side view of the flux concentrator exemplifying a magnetic polarization having an altered orientation.
Figure 6:
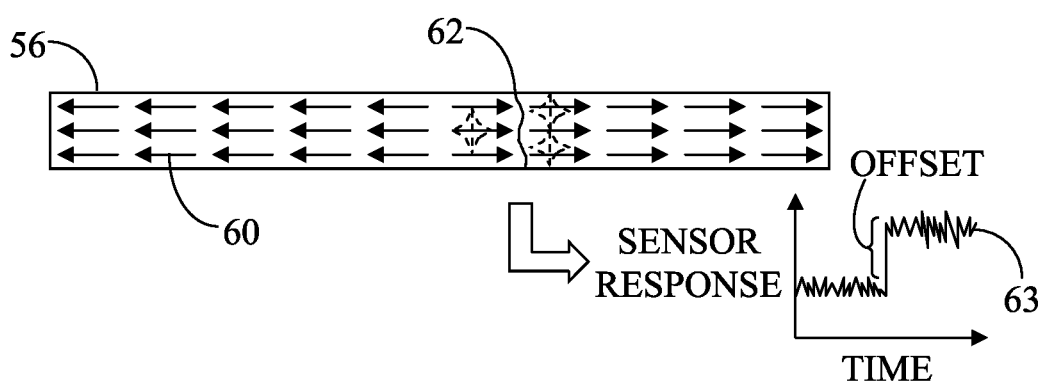
FIG. 6 shows a side view of the flux concentrator exemplifying a magnetic polarization having an unstable orientation.

FIG. 5 shows a side view of flux concentrator 56 exemplifying a magnetic polarization 61 (represented by leftwardly directed arrows) having an altered orientation. Thus magnetic polarization 61 is referred to hereinafter as an altered magnetic state 61. FIG. 5 is provided to show the altered magnetic state of flux concentrator 56 in response to exposure to an externally applied magnetic field of sufficient strength (referred to herein as a magnetic shock event). As shown, altered magnetic state 61 may be directed in a uniform, i.e., generally single, direction that is opposite to the preferred magnetization orientation for flux concentrator 56, e.g., baseline magnetic state 58. The change in magnetization from baseline magnetic state 58 (FIG. 4) to altered magnetic state 61 can lead to offset shifts in the output signal, known as perming, FIG. 6 shows a side view of flux concentrator 56 exemplifying a magnetic polarization 60 having an unstable orientation. Again, FIG. 6 is provided to show another type of altered magnetic state of flux concentrator 56 in response to exposure to an externally applied magnetic field of sufficient strength that results in a split polarization condition. Thus, magnetic polarization 60 is also referred to hereinafter as an altered magnetic state 60 of flux concentrator 56. In this example, exposure to a magnetic shock event can reorient baseline magnetic state 58 (FIG. 4) of flux concentrator 56 so that upon returning to its low field sensing configuration, magnetic domain walls 62 (one shown) may be present in flux concentrator 56. As exemplified in FIG. 5, magnetic domain walls 62 are regions in flux concentrator 56 at which the magnetic polarization points in different directions, resulting in altered magnetic state 60.

The presence of one or more magnetic domain walls 62 results in non-uniformity in altered magnetic state 60. Furthermore, domain walls 62 may travel up and down the length of flux concentrator 56, thereby modulating the local field at the magnetic sense elements. The change in magnetization from baseline magnetic state 58 (FIG. 4) to altered magnetic state 60 can also lead to detrimental changes in magnetic sensor performance which can lead to elevated noise levels in the output signal 63, offset shifts, and virtual rotation of sensor axis alignment. Exemplary embodiments described below recondition a ferromagnetic structure (e.g., flux concentrator 56) by resetting its magnetic orientation from either of altered magnetic states 61 (as exemplified in FIG. 5) or 60 (as exemplified in FIG. 6) to baseline magnetic state 58 (as exemplified in FIG. 4) after being corrupted by an external disturbing field (e.g., a magnetic shock event).

Figure 7:
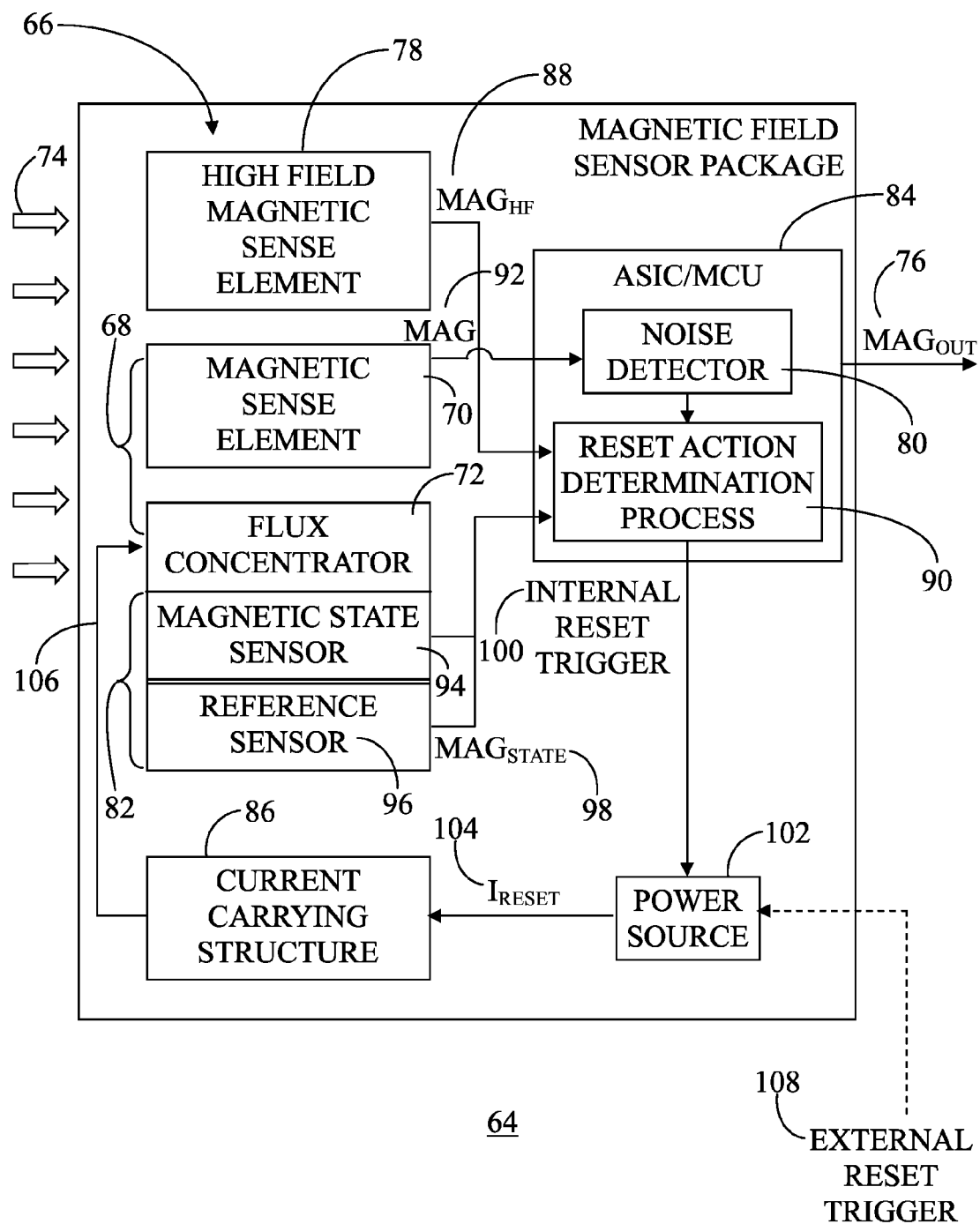
FIG. 7 shows a block diagram of a sensor package having a corruption detection and reset subsystem in accordance with an embodiment.

FIG. 7 shows a block diagram of a sensor package 64 having a corruption detection and reset subsystem 66 in accordance with an embodiment. Sensor package 64 generally includes a magnetic field sensor 68 having one or more magnetic sense elements 70 (one depicted) and one or more ferromagnetic structures, e.g., flux concentrators 72 (one depicted). Magnetic field sensor 68 is adapted to sense an external magnetic field 74, depicted by arrows, and flux concentrator 72 is configured for shielding, flux concentrating, or flux redirecting purposes in accordance with a particular design. Sensor package 64 produces an output signal 76, labeled $MAG_{OUT}$, indicative of external magnetic field 74.

For simplicity of illustration, magnetic field sensor 68 is generally shown with a single magnetic sense element 70 and a single flux concentrator 72, and is therefore adapted to sense external magnetic field 74 along a single axis and produce a single output signal 76. It should be understood, however, that sensor package 64 may be adapted to sense an external magnetic field along more than one axis, such as sensor package 20 (FIG. 1). In such a configuration, sensor package 64 would include multiple magnetic field sensors (e.g., X-axis magnetic field sensor 24, Y-axis magnetic field sensor 26, and Z-axis magnetic field sensor 28 shown in FIG. 1) and multiple suitably configured flux concentrators, such as those represented in FIGS. 2 and 3. Furthermore, magnetic field sensor 68 may include any quantity of sense elements 70 and flux concentrators 72 in accordance with particular design parameters.

Subsystem 66, incorporated in sensor package 64, includes at least one detector element 78, 80, 82 configured to detect altered magnetic states 61 or 60 (exemplified in FIGS. 5 and 6) of flux concentrator 72, a processor 84 configured to determine when a reset action is needed in response to altered magnetic state 61 or 60, and a current carrying structure 86 positioned in proximity to flux concentrator 72. Current carrying structure 86 is utilized to apply a reset magnetic field 106 to flux concentrator 72 to reset flux concentrator 72 from altered magnetic state 61 or 60 to baseline magnetic state 58 (FIG. 4). Accordingly, subsystem 66 monitors for an altered magnetic state of a ferromagnetic structure within a magnetic field sensor package, determines whether a reset action is needed in response to the monitored data, and applies a reset magnetic field to the ferromagnetic structure only when a reset is needed.

Detector element 78 of subsystem 66 includes a high field magnetic sense element. Thus, detector element 78 is referred to hereinafter as high field magnetic sense element 78. High field magnetic sense element 78 exhibits a sensitivity to external magnetic field 74 that is less than the sensitivity of magnetic sense element 70 of package 64. By way of example, magnetic sense element 70 may be configured to detect external magnetic field 74 at a magnitude that is, for example, significantly less than thirty Gauss. However, high field magnetic sense element 78 may be configured to detect external magnetic field 74 only when it exceeds a magnetic field threshold. This magnetic field threshold can correspond to an expected magnitude of a magnetic shock event of, for example, approximately thirty Gauss or more.

When external magnetic field 74 exceeds the predetermined magnetic field threshold, high field magnetic sense element 78 produces an output signal 88, labeled $MAG_{HF}$ in FIG. 7. Output signal 88 is indicative of an external disturbing field (e.g., a magnetic shock event) that may have been sufficient to alter the magnetic state of flux concentrator 72. Thus, the presence of output signal 88 provides "detection" of a possible or anticipated magnetic state of flux concentrator 72. Output signal 88 is communicated to processor 84. Processor 84 executes a reset action determination process 90 to determine whether a reset action is required in response to receipt of output signal 88, as will be discussed in greater detail below.

In the in-plane sensing directions (e.g., X-axis 36 and Y-axis 38 depicted in FIG. 2), the sensitivity of high field magnetic sense element 78 may be effectively decreased in a tunnel magnetoresistance (TMR) configuration by increasing the magnetic bias of the free layer. The magnetic bias of the free layer can be increased by reducing the spacing from the permanent magnet. Alternatively, in the in-plane sensing directions, the sensitivity may be effectively decreased by increasing shielding of the ferromagnetic layers over high field magnetic sense element 78. In an out-of-plane direction (e.g., Z-axis 40 depicted in FIG. 3), a TMR configuration of high field magnetic sense element 78 may use a flux concentrator or a Hall sensor to achieve a suitable sensitivity.

Detector element 80 of subsystem 66 is included in processor 84, and is referred to hereinafter as noise detector 80. Noise detector 80 may be software, hardware, or a combination of software and hardware adapted to receive one or more output signals 92, labeled MAG, from magnetic sense element 70 and detect a noise component on one or more output signals 92. Processor 84, executing reset action determination process 90, can determine whether a reset action is required when the noise component on output signal 92 exceeds a noise threshold, as will be discussed in greater detail below.

Detector element 82 of subsystem 66 includes a magnetic state sensor 94 and a reference sensor 96, and is referred to hereinafter as a flux concentrator state sensor 82. Magnetic state sensor 94 is a magnetic field sensor that is located in proximity to flux concentrator 72. Magnetic state sensor 94 is configured to detect a magnetic state of flux concentrator 72. Reference sensor 96 is also magnetic field sensor. However, reference sensor 96 is displaced away from flux concentrator 72 and therefore does not detect the magnetic state of flux concentrator 72. Instead, reference sensor 96 detects an ambient magnetic field. As will be discussed in greater detail below, a state signal 98, labeled $MAG_{STATE}$, is provided by state sensor system 82. State signal 98 is indicative of a difference in magnetic polarization between magnetic state sensor 94 and reference sensor 96. Thus, state signal 98 provides a direct indication of altered magnetic state 61 (FIG. 5) of flux concentrator 72. State signal 98 is communicated to processor 84. Processor 84, executing reset action determination process 90, can determine whether a reset action is required when state signal 98 exceeds a difference threshold or falls outside of a predetermined range, as will be discussed in greater detail below.

Thus, corruption detection and reset subsystem 66 incorporated in sensor package 64 includes detector elements that monitor the environmental (exposure) conditions, the magnetic sensor output itself, and the state of critical ferromagnetic structural components of the magnetic sensor. More particularly, high field magnetic sense element 78 may be implemented for direct detection of a high magnetic field disturbing event (e.g., a magnetic shock event) indicating that flux concentrator 72 may be subject to magnetic corruption. Noise detector 80 implemented at processor 84 directly monitors the magnetic sensor output for noise levels indicative of magnetic corruption of the ferromagnetic structure. And, magnetic state sensor 94 of state sensor system 82 closely coupled to a section of the ferromagnetic structure together with reference sensor 96 provide direct monitoring of the magnetic state of the ferromagnetic structure.

The embodiment of FIG. 7 includes three detector elements 78, 80, 82 for illustrative purposes. However, alternative embodiments may include a single mode of monitoring or any suitable combination of two modes of monitoring for magnetic corruption of flux concentrator 72.

Processor 84 of subsystem 66 may be incorporated as part of an ASIC or microcontroller of magnetic field sensor package 64. Processor 84 may perform some or all functions of sensor package 64 including, but not limited to, signal conditioning and data management, stabilization control, bridge/output multiplexing, self-test, electrostatic discharge (ESD) protection, and so forth to produce output signal 76. Additionally, processor 84 is configured to execute reset action determination process 90 in order to accumulate and analyze the information from detector elements 78, 80, 82 with appropriate fusing of the input information. Processor 84, executing reset action determination process 90, is further configured to deduce whether a performance-altering magnetic shock event has occurred and to determine when to trigger a reset action to reset flux concentrator 72 from either of altered magnetic states 61 or 60 (exemplified in FIGS. 5 and 6) back to baseline magnetic state 58 (FIG. 4). Although a single ASIC/MCU 84 is shown, it should be understood that sensor package 64 may include multiple processors adapted to perform various functions, as well as to execute reset action determination process 90.

When a determination is made at processor 84 that a reset action is needed, processor 84 communicates an internal reset trigger 100 to a power source 102. Power source 102 may include a battery, a connection to power external to magnetic field sensor package 64, and/or control circuitry for management and provision of the power. In response to internal reset trigger 100, power source 102 is configured to apply a direct current (DC) electric reset current 104, labeled $I_{RESET}$, to current carrying structure 86. Reset current 104 generates reset magnetic field 106 at current carrying structure 86, and a vector component of reset magnetic field 106 is applied to flux concentrator 72 in order to reverse the magnetization orientation and/or eliminate any domain walls 62 or other defects in the magnetic state of flux concentrator 72 (as exemplified in FIGS. 5 and 6).

Reset current 104 is a non-pulsed or pulsed electric current configured to generate reset magnetic field 106 such that the vector component of reset magnetic field 106 is of sufficient magnitude and proper orientation to reset flux concentrator 72 from the altered magnetic state back to its baseline magnetic state 58 (FIG. 4). In some embodiments, the magnitude of reset magnetic field 106 may be approximately thirty Gauss. In other embodiments, the magnitude may be approximately one hundred Gauss. And in still other embodiments, the magnitude may be somewhere between approximately thirty and approximately one hundred Gauss. The magnitude may be less than thirty Gauss and more than one hundred Gauss in still other embodiments.

In an embodiment, current carrying structure 86 may be a continuous coil structure located in proximity to flux concentrator 72. For example, current carrying structure 86 may be positioned within a distance of approximately five microns from flux concentrator 72, although the distance may be larger or smaller as well. Additionally, current carrying structure 86 may have a variety of shapes, sizes, and numbers of coils in accordance with a particular design best suited for applying reset magnetic field 106 to flux concentrator 72. It should be further observed that in some embodiments, power source 102 may optionally be triggered via an external reset trigger 108 to provide reset current 104 to current carrying structure 86 periodically on a fixed schedule or when a user manually initiates a reset.

Figure 8:
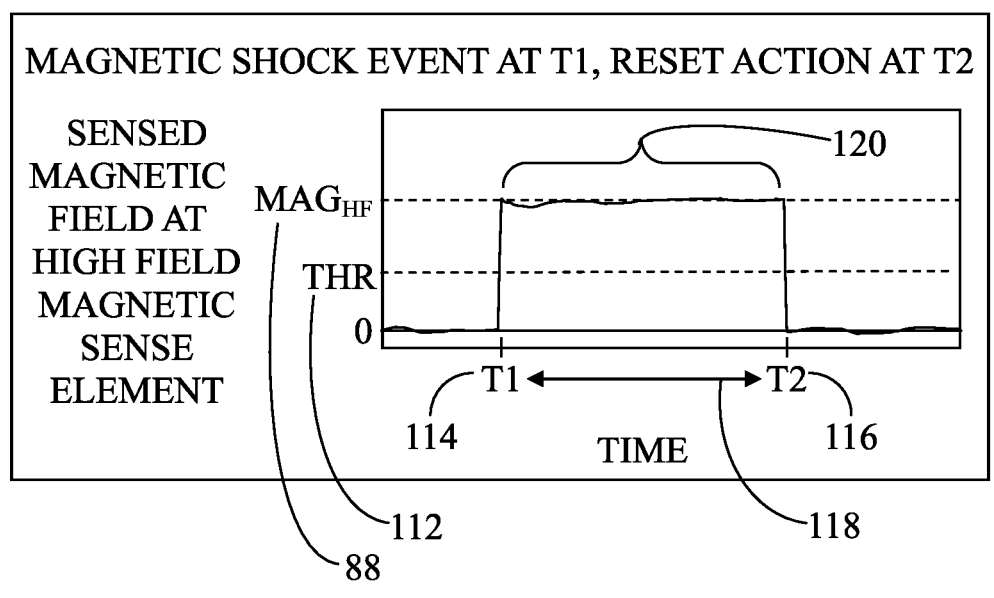
FIG. 8 shows a chart exemplifying the direct detection of a magnetic shock event that may result in an altered magnetic state of a flux concentrator of the sensor package of FIG. 7.

Referring FIGS. 7 and 8, FIG. 8 shows a chart 110 exemplifying the direct detection of a magnetic shock event 120 that may result in, or otherwise cause, an altered magnetic state of flux concentrator 72. High field magnetic sense element 78 of corruption detection and reset subsystem 66 is used for direct detection magnetic shock event 120. The detection of magnetic shock event 120 indicates the probability of an altered magnetic state of flux concentrator. It should be recalled that high field magnetic sense element 78 is configured to exhibit a relatively low sensitivity so that it does not detect external magnetic field 74 unless the magnitude of external magnetic field 74 exceeds a predetermined threshold 112.

As shown in chart 110, high field magnetic sense element 78 typically senses approximately zero for external magnetic field 74 due to its low sensitivity to external magnetic field 74. However, as further shown, at time "T1" 114, high field magnetic sense element 78 produces output signal 88. The magnitude of output signal 88 exceeds threshold 112. Additionally, output signal 88 may exceed threshold 112 from time "T1" 114 to time "T2" 116 determined to be of a duration 118 sufficient to alter the magnetic state of flux concentrator 72. This change in output signal 88 from zero to a magnitude that exceeds threshold 112 for duration 118 signifies a high field disturbing event, i.e., magnetic shock event 120, that could result in altering the magnetic state of flux concentrator 72 from baseline magnetic state 58 (FIG. 4). In response to direct detection of magnetic shock event 120, execution of reset action determination process 90 may result in the production of internal reset trigger 100, the provision of reset current 104 to current carrying structure 86, and the generation of reset magnetic field 106 to reset flux concentrator 72 back to baseline magnetic state 58.

Figure 9:
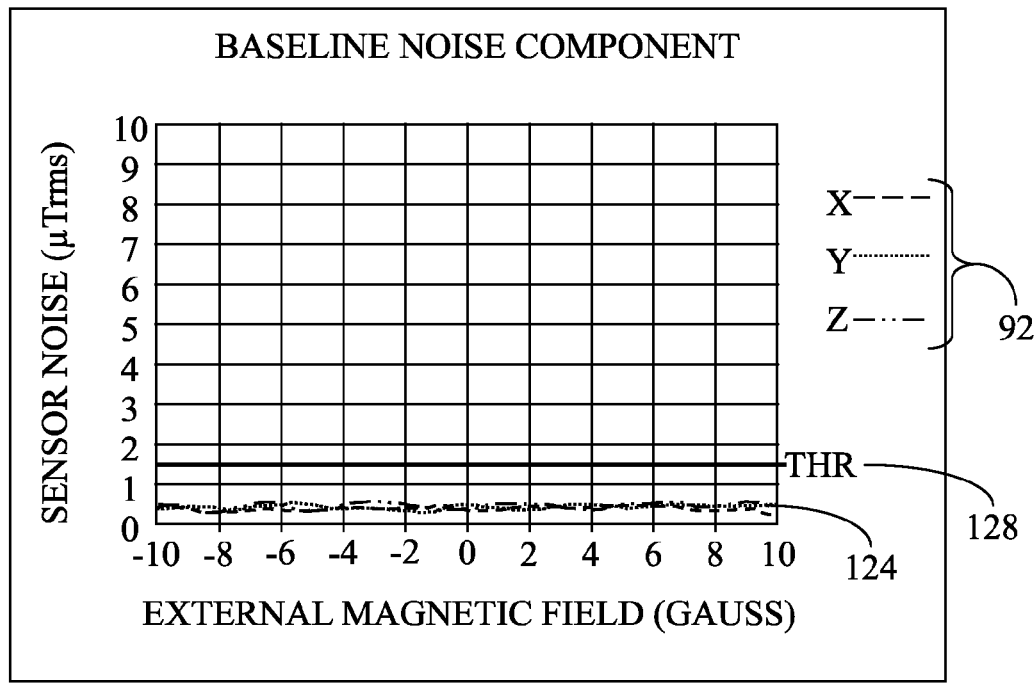
FIG. 9 shows a chart exemplifying a baseline noise component imposed upon output signals of the sensor package of FIG. 7.
Figure 10:
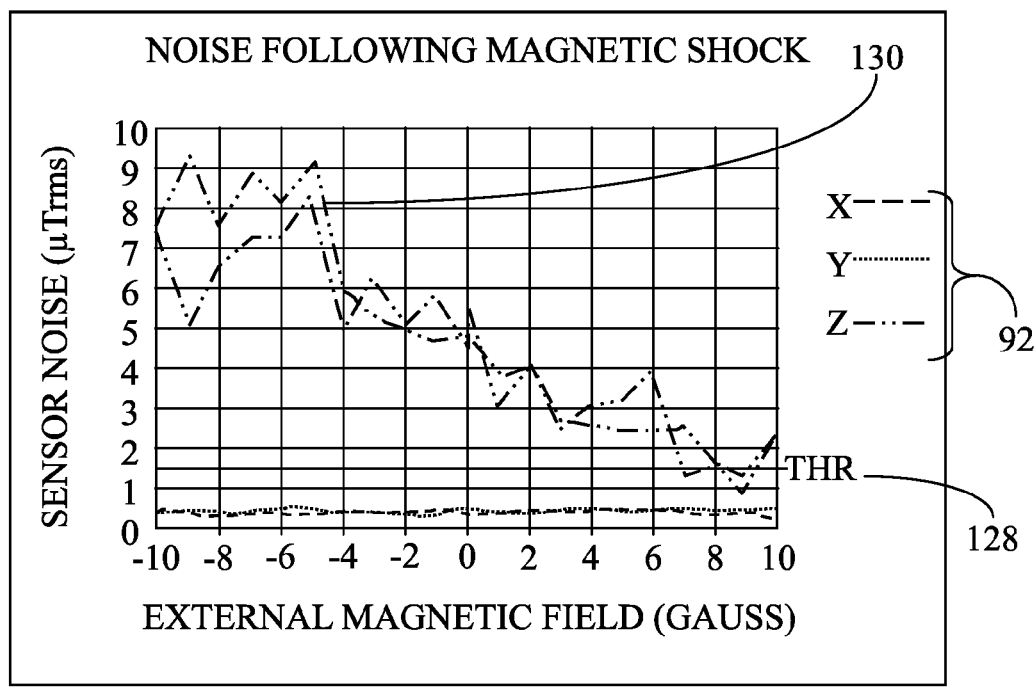
FIG. 10 shows a chart exemplifying the direct monitoring of output signals from magnetic sense elements for noise levels indicative of magnetic corruption of flux concentrators of the sensor package of FIG. 7.

Referring to FIGS. 9 and 10 in connection with FIG. 7, FIG. 9 shows a chart 122 exemplifying a baseline noise component 124 imposed upon output signals 92 of one or more magnetic sense elements 70 of magnetic field sensor package 64, and FIG. 10 shows a chart 126 exemplifying the direct monitoring of output signals 92 from magnetic sense elements 70 for noise levels indicative of magnetic corruption of flux concentrator 72.

As mentioned previously, noise detector 80 of processor 84 is adapted to receive one or more output signals 92, labeled MAG, from magnetic sense element(s) 70 and detect a noise component on one or more output signals 92. As generally shown in chart 122, baseline noise component 124 on output signals 92 (X-axis, Y-axis, and Z-axis) is below a noise threshold 128. However, as shown in chart 126, a noise component 130 on output signal 92 for Z-axis magnetic field sensing exceeds noise threshold 128. This noise component 130 exceeding noise threshold 128 is indicative of magnetic corruption of flux concentrator 72 from a magnetic shock event. In response to noise component 130 exceeding noise threshold 128, execution of reset action determination process 90 may result in the production of internal reset trigger 100, the provision of reset current 104 to current carrying structure 86, and the generation of reset magnetic field 106 to reset flux concentrator 72 back to baseline magnetic state 58 (FIG. 4).

Figure 11:
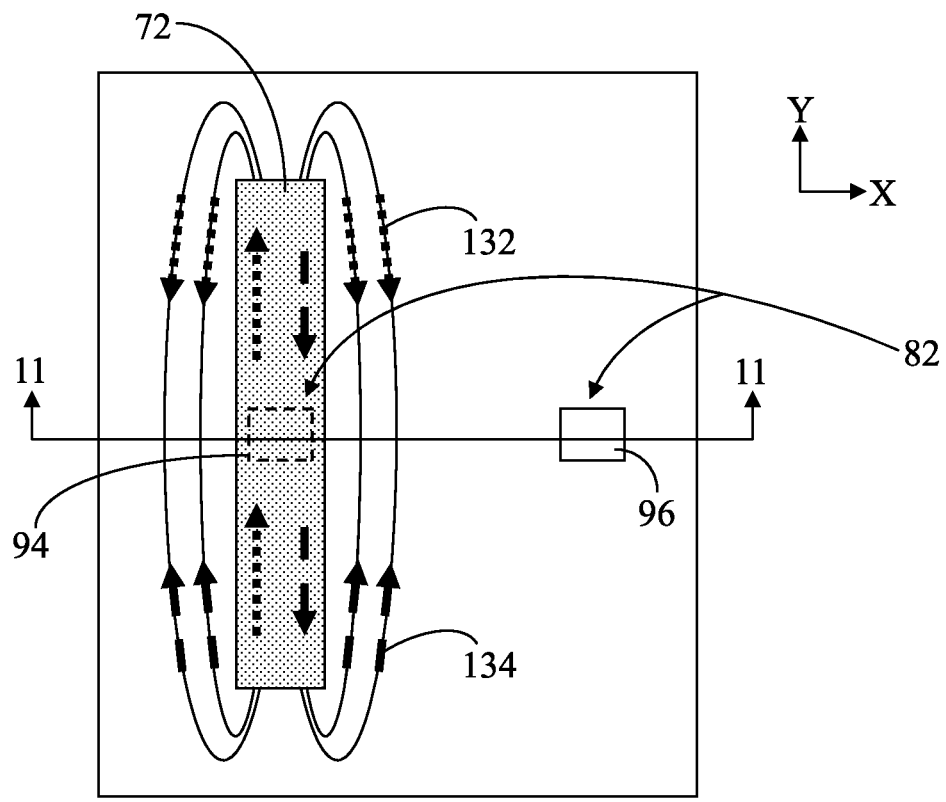
FIG. 11 shows a simplified top view of the implementation of a state sensor system to monitor the magnetic state of a flux concentrator of the sensor package of FIG. 7.
Figure 12:
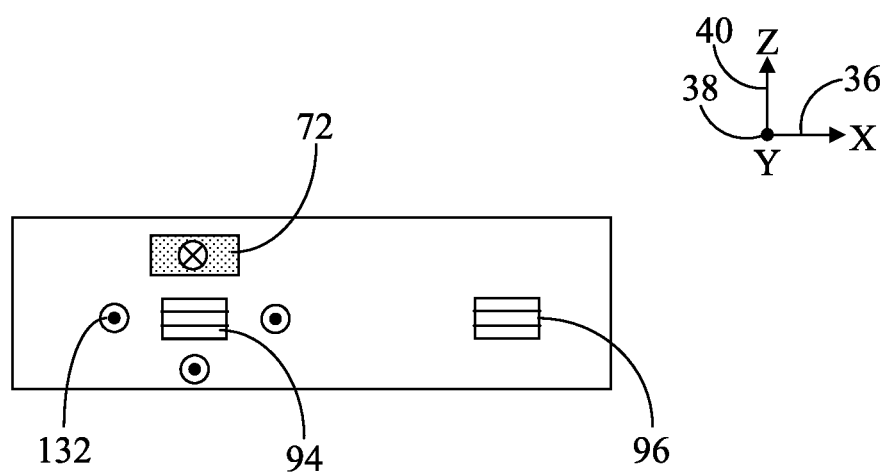
FIG. 12 shows a simplified cross-sectional side view of the state sensor system with the flux concentrator.

Referring to FIGS. 11 and 12 in connection with FIG. 7, FIG. 11 shows a simplified top view of the implementation of state sensor system 82 to directly monitor the magnetic state of flux concentrator 72 and FIG. 12 shows a simplified cross-sectional side view of state sensor system 82 with flux concentrator 72. In the illustration of FIG. 11, magnetic state sensor 94 underlies flux concentrator 72. Hence, magnetic state sensor 94 is shown in dashed line view since it is obscured from sight in FIG. 11. As further shown in the illustration of FIG. 11, reference sensor 96 is spatially displaced away from flux concentrator 72.

FIGS. 11 and 12 are illustrated to demonstrate an altered magnetic state of flux concentrator 72 in response to a disturbing event occurring within external magnetic field 74 relative to a baseline magnetic state. To that end, a first magnetic field path 132, represented by dotted lines, represents altered magnetic state 61 (FIG. 5), and a second magnetic field path 134, represented by dashed lines, represents baseline magnetic state 58 (FIG. 4). Both first and second magnetic field paths 132, 134 are present in FIG. 11 as basis for comparison and for simplicity of illustration. However, as discussed above in connection with FIGS. 4 and 5, flux concentrator 72 will either be in baseline magnetic state 58 or altered magnetic state 61. Magnetic state sensor 94 is adapted to detect the magnetic state of flux concentrator 72, e.g., exemplified by first and second magnetic field paths 132, 134, relative to reference sensor 96 following an external disturbing field (e.g., a magnetic shock event).

Figure 13:
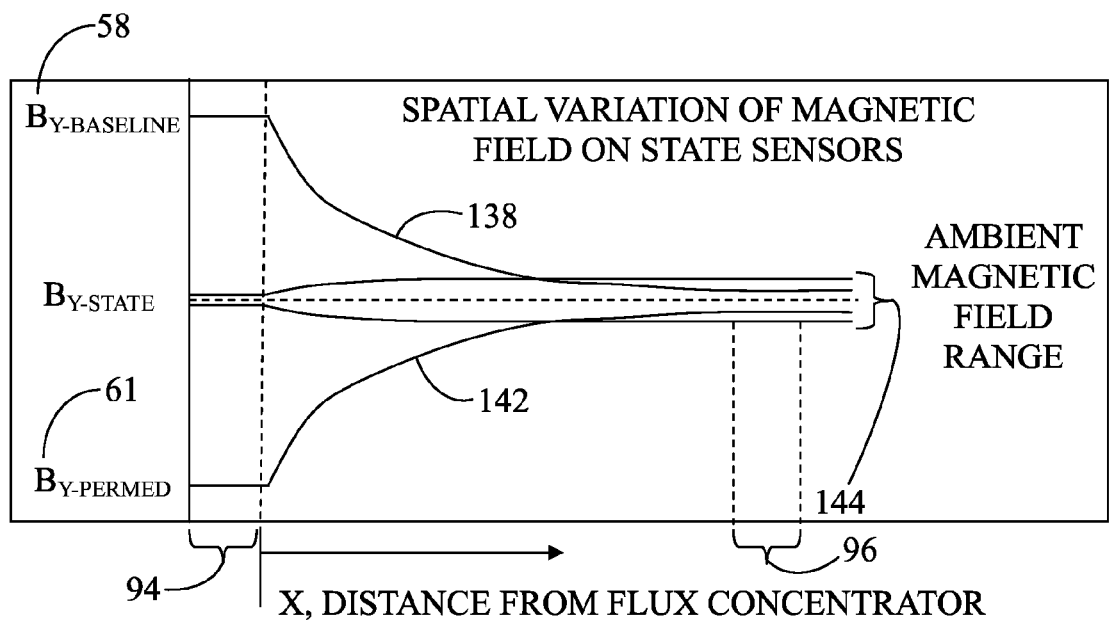
FIG. 13 shows a chart exemplifying a spatial variation of a magnetic field on state sensors of the state sensor system of FIG. 11.
Figure 14:
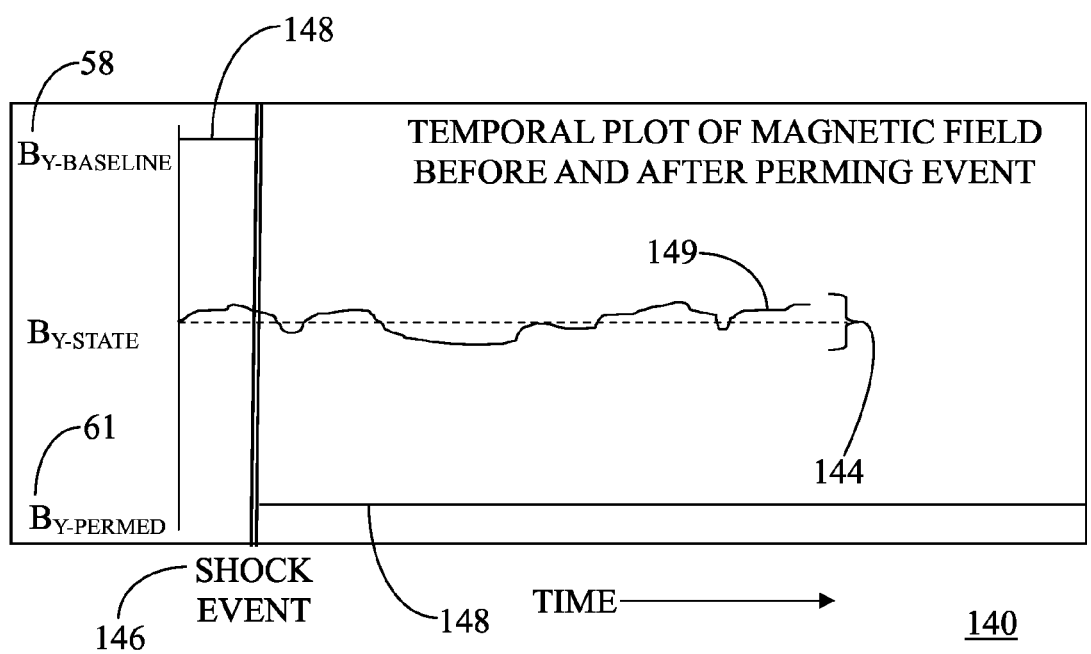
FIG. 14 shows a chart exemplifying a temporal plot of a magnetic field before and after a perming event using the state sensor system of FIG. 11.

Referring now to FIGS. 13 and 14, FIG. 13 shows a chart 136 exemplifying a spatial variation of the magnitude of the magnetic field on state sensors 94, 96 of state sensor system 82 (FIG. 11), and FIG. 14 shows a chart 140 exemplifying a temporal plot of the magnitude of the magnetic field before and after a perming event using state sensor system 82, which includes magnetic state sensor 94 and reference sensor 96 (see FIG. 11).

As shown in chart 136, a first spatial plot line 138 demonstrates baseline magnetic state 58, labeled $B_{Y-BASELINE}$, of flux concentrator 72 (corresponding to second magnetic field path 134 of FIG. 11) as sensed at magnetic state sensor 94. First spatial plot line 138 falls within an ambient magnetic field range 144 as sensed at reference sensor 96, spaced a distance "X" away from flux concentrator 72. That is, baseline magnetic state 58, as represented by first spatial plot line 138, represents the magnetic polarization of flux concentrator 72 when it has not been subjected to a disturbing magnetic field.

As further shown in chart 136, a second spatial plot line 142 represents altered magnetic state 61, labeled $B_{Y-PERMED}$, of flux concentrator 72 (corresponding to first magnetic field path 132 of FIG. 11) as sensed at magnetic state sensor 94. Second spatial plot line 142 also falls within ambient magnetic field range 144, as sensed at reference sensor 96, spaced distance "X" away from flux concentrator 72. Thus second spatial plot line 142 is presented to demonstrate a perming event in which the magnetic polarization of flux concentrator 72 in altered magnetic state 61 may be opposite to the magnetic polarization of flux concentrator 72 in baseline magnetic state 58.

Accordingly, the magnetic polarization of flux concentrator 72 in altered magnetic state 61 opposes the magnetic polarization of flux concentrator 72 in baseline magnetic state 58, as detected at magnetic state sensor 94. For example, the magnitude of the magnetic field in altered magnetic state 61 may be approximately equal but opposite in direction to the magnitude of the magnetic field in baseline magnetic state 58. However, the magnetic field sensed at reference sensor 96, regardless of whether flux concentrator 72 is in altered magnetic state 61 or in baseline magnetic state 58 will be generally equivalent. As such, a difference between the magnetic polarization sensed at magnetic state sensor 94 and sensed at reference state sensor 96 provides an indication of altered magnetic state 61 relative to baseline magnetic state 58. This difference can be communicated to processor 84 (FIG. 7) as state signal 98 (FIG. 7).

As illustrated in the temporal plot of FIG. 14, prior to a magnetic shock event 146 a magnitude of a magnetic field 148 sensed at magnetic state sensor 94 indicates that flux concentrator 72 is in baseline magnetic state 58. However, following magnetic shock event 146, magnitude of the magnetic field 148 sensed at magnetic state sensor 94 now indicates that flux concentrator 72 is in altered magnetic state 61. In comparison, a magnitude of a magnetic field 149 measured at reference sensor 96 over the same time period remains within ambient magnetic field range 144. Thus, chart 140 demonstrates a condition in which a perming effect (which can produce offset shifts in sensor output) has resulted in response to magnetic shock event 146 occurring at some point in time. In response to the detection of altered magnetic state 61 via state signal 98 (FIG. 7), execution of reset action determination process 90 may result in the production of internal reset trigger 100, the provision of reset current 104 to current carrying structure 86, and the generation of reset magnetic field 106 to reset flux concentrator 72 back to baseline magnetic state 58 (FIG. 4).

Figure 15:
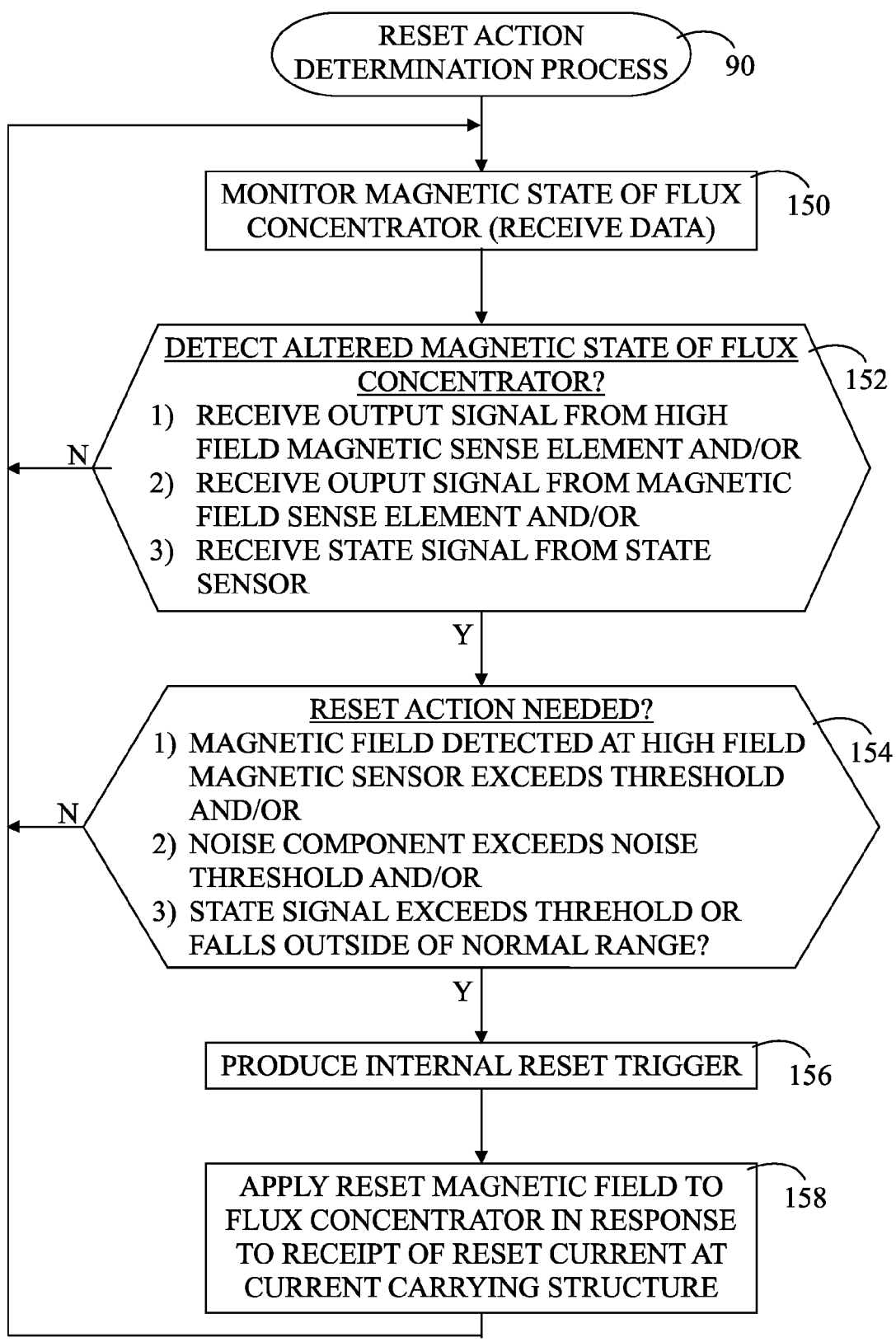
FIG. 15 shows a flowchart of a reset action determination process in accordance with another embodiment.

Referring to FIGS. 7 and 15, FIG. 15 shows a flowchart of reset action determination process 90 executed within corruption detection and reset subsystem 66 in accordance with another embodiment. In general, flux concentrator reset process 90 is performed to detect an altered magnetic state of a ferromagnetic structure within a magnetic field sensor package, determine whether a reset action is needed in response to the monitored data, and apply a reset magnetic field to the ferromagnetic structure only when a reset is needed.

Process 90 is performed in a sensor package (e.g., sensor package 64) that includes three detector elements, e.g., high field magnetic sense element 78, noise detector 80, and state sensor system 82. The monitored data from the three detector elements 78, 80, 82 may be fused to determine whether a reset action is needed. In alternative embodiments, having more than or less than the three detector elements, a determination as to whether a reset action is needed can be made based on the combined received monitored data.

At a block 150 of process 90, subsystem 66 monitors the magnetic state and/or anticipated magnetic state of flux concentrator 72 directly and/or indirectly. More particularly, data from the detector elements (e.g., high field magnetic sense element 78, noise detector 80, and state sensor system 82) is received at processor 84. In response to the receipt of monitored data, a query block 152 determines whether an altered magnetic state of flux concentrator 72 can be deduced. In the exemplary embodiment having three detector elements, an altered magnetic state of flux concentrator 72 may be detected in response to 1) receipt of output signal 88 from high field magnetic sense element 78, and/or 2) receipt of output signal 92 from magnetic sense element 70 of magnetic field sensor package 62, and/or 3) receipt of state signal 98.

At query block 152, when the monitored data falls within normal ranges, it can be deduced that flux concentrator 72 is in its baseline magnetic state 58 (FIG. 4). As such, process control loops back to block 150 to continue monitoring the magnetic state of flux concentrator 72. However, when at least some of the monitored data falls outside of normal ranges, it can be deduced that flux concentrator 72 may be in either of altered magnetic states 61 and 60 (FIGS. 5 and 6). As such, process 90 proceeds to a query block 154.

At query block 154, processor 84 determines whether a reset action is needed in response to the altered magnetic state. That is, processor 84 can make an intelligent determination by fusing the monitored data from high field magnetic sense element 78, from detector element 80, and from state sensor system 82. In an embodiment, processor 84 determines whether 1) output signal 88 detected at high field magnetic sense element 78 exceeds threshold 112 (FIG. 7), and/or 2) whether noise component 130 (FIG. 9) in output signal 92 from magnetic sense element 70 (as determined by detector element 80) exceeds noise threshold 128 (FIG. 9), and/or 3) whether state signal 98, representing the difference in magnetic polarization between magnetic state sensor 94 and reference sensor 96, exceeds a difference threshold.

When processor 84 determines that a reset action is not needed, process control loops back to block 150 to continue monitoring the magnetic state of flux concentrator 72. However, when processor 84 determines that a reset action is needed in response to the monitored data, process 90 continues at a block 156. At block 156, processor 84 produces internal reset trigger 100. Internal reset trigger 102 is communicated to power source 102 and power source 100 communicates reset current 104 to current carrying structure 86.

At a block 158, reset magnetic field 106 is applied to flux concentrator 72 in response to receipt of reset current 104 at current carrying structure 86. That is, reset current 104 generates reset magnetic field 106 about the conductive segments of current carrying structure 86. A vector component of reset magnetic field 106 of sufficient magnetic flux density magnitude and proper orientation is applied to flux concentrator 72 via current carrying structure 86 in order to reset a magnetic polarization of flux concentrator 72 from altered magnetic state 60 back to its baseline magnetic state 58 (FIG. 4). The vector component of reset magnetic field 106 should meet or exceed a minimum threshold level of magnetic flux density sufficient to reset, i.e., "clean," the magnetic polarization of flux concentrator 72 to produce the stable, baseline magnetic state 58 (FIG. 4).

After flux concentrator 72 is reset to the magnetic state from altered magnetic state 61 (FIG. 5) and/or to purge domain walls 62 (FIG. 6) so as to return to baseline magnetic state 58 (FIG. 4), power source 102 may discontinue the provision of reset current 104, and magnetic sense element 70 with flux concentrator 72 within sensor package 64 may be utilized to sense external magnetic field 74. Thereafter, process control loops back to block 150 to continue monitoring the magnetic state and/or the anticipated magnetic state of flux concentrator 72.

Figure 16:
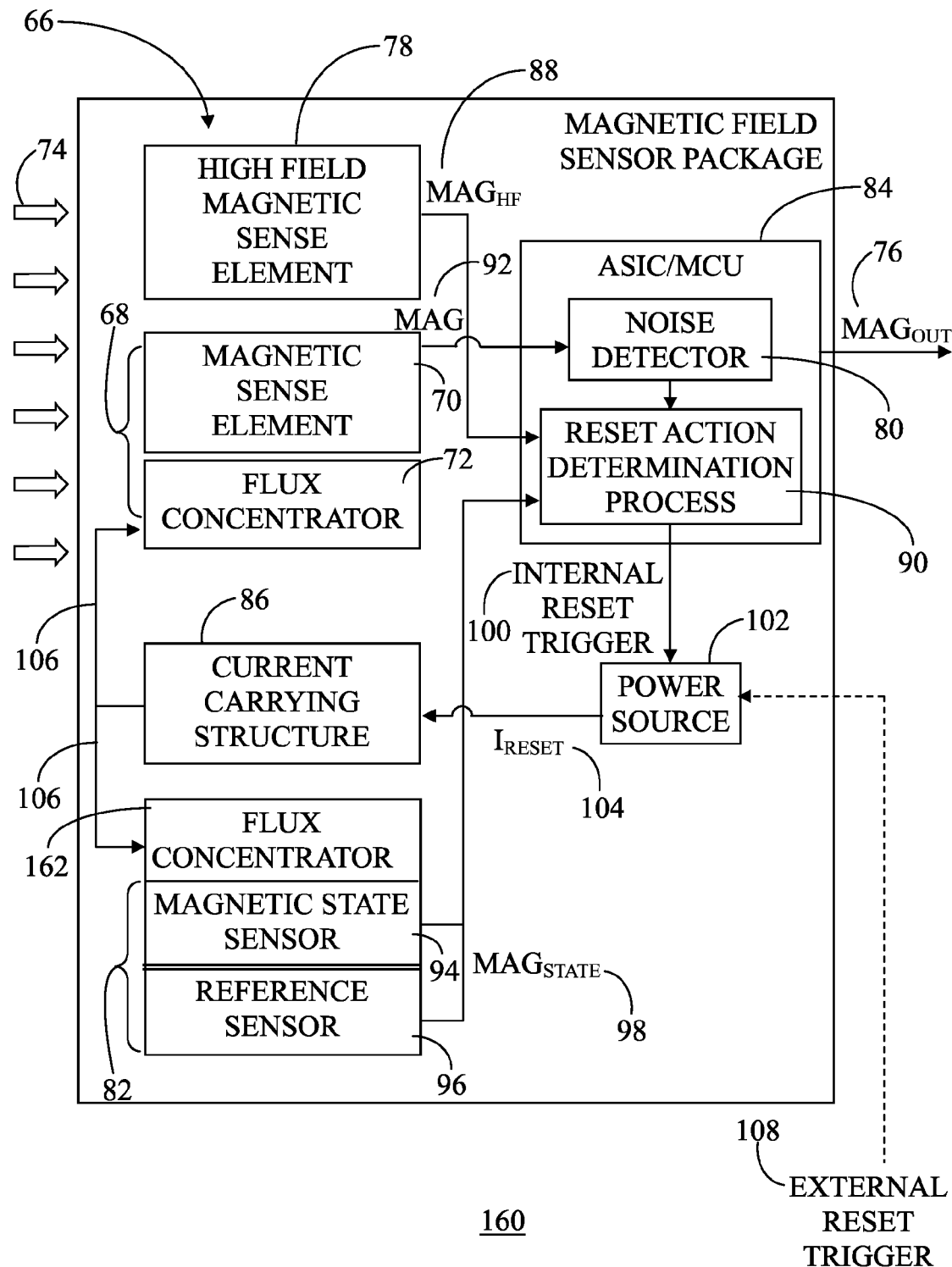
FIG. 16 shows a block diagram of a sensor package in accordance with another embodiment.

FIG. 16 shows a block diagram of a sensor package 160 in accordance with another embodiment. Sensor package 160 includes many of the components also included in sensor package 64 (FIG. 7). These components include magnetic sense element 70, flux concentrator 72, high field magnetic sense element 78, detector element 80, state sensor system 82, processor 84, current carrying structure 86, and power source 102. Details of the components and their function that are common to the components described above in connection with sensor package 64 will not be repeated herein.

A primary differentiation of sensor package 160 relative to sensor package 64 is that sensor package 160 includes a separate, second flux concentrator 162 that functions as a proxy for flux concentrator 72. Accordingly, state sensor system 82 monitors a magnetic state of second flux concentrator 162. An altered magnetic state of second flux concentrator 162 is indicative of the altered magnetic state of flux concentrator 72. Therefore, determination of an altered magnetic state of second flux concentrator 162 may be used to determine whether flux concentrator 72 and second flux concentrator 162 are to be reset.

It is to be understood that certain ones of the process blocks depicted in FIG. 15 may be performed in parallel with each other or with performing other processes. Furthermore, it is to be understood that the particular ordering of the process blocks depicted in FIG. 15 may be modified, while achieving substantially the same result. Accordingly, such modifications are intended to be included within the scope of the inventive subject matter. In addition, although particular system configurations are described in conjunction with FIGS. 7 and 16, above, embodiments may be implemented in systems having other architectures, as well. These and other variations are intended to be included within the scope of the inventive subject matter.

Thus, various embodiments of a sensor package having a corruption detection and reset subsystem and methodology for detecting corruption of the magnetic state of a ferromagnetic structure and resetting the ferromagnetic structure to a baseline magnetic state have been described. An embodiment of a method in a sensor package having a ferromagnetic structure, the ferromagnetic structure being characterized by a baseline magnetic state, wherein the method comprises detecting an altered magnetic state of the ferromagnetic structure, the altered magnetic state differing from the baseline magnetic state. The method further comprises determining, at a processor within the sensor package, when a reset action is needed in response to the altered magnetic state and applying a reset magnetic field to the ferromagnetic structure via a current carrying structure positioned in proximity to the ferromagnetic structure to reset the ferromagnetic structure to the baseline magnetic state.

An embodiment of a sensor package comprises a magnetic field sensor, the magnetic field sensor including a magnetic sense element and a ferromagnetic structure proximate the magnetic sense element, the ferromagnetic structure being characterized by a baseline magnetic state. The sensor package further comprises a subsystem incorporated in the sensor package. The subsystem comprises a detector element configured to detect an altered magnetic state of the ferromagnetic structure, the altered magnetic state differing from the baseline magnetic state, a processor configured to determine when a reset action is needed in response to the altered magnetic state, and a current carrying structure positioned in proximity to the ferromagnetic structure, the current carrying structure being utilized to apply a reset magnetic field to the ferromagnetic structure to reset the ferromagnetic structure to the baseline magnetic state.

The methodology and sensor package, discussed above, and the inventive principles thereof enable the detection of corruption of the magnetic state of a ferromagnetic structure in a magnetic field sensor package and resetting the ferromagnetic structure to a baseline magnetic state. A corruption detection and reset subsystem within the sensor package ensures that the magnetic field sensor is "smart" in that it detects or otherwise anticipates a corrupting magnetic shock event directly and/or detects the effects of the magnetic shock event on the magnetization state of the ferromagnetic structures and/or detects the effects of the magnetic shock event on the output of the magnetic field sensor. The monitored data is analyzed within the subsystem to determine if and went to initiate a reset action. Accordingly, a reset action is applied when a reset is needed, as opposed to triggering periodically on a set schedule or tied to an external event, thereby achieving savings in power consumption.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. In a sensor package having a ferromagnetic structure, said ferromagnetic structure being characterized by a baseline magnetic state, a method comprising:
   detecting an altered magnetic state of said ferromagnetic structure, said altered magnetic state differing from said baseline magnetic state, wherein said detecting comprises:
      detecting an external magnetic field at a high field magnetic sense element of a subsystem included in said sensor package, wherein said high field magnetic sense element is a first magnetic sense element, and said first magnetic sense element exhibits a first sensitivity to said external magnetic field that is less than a second sensitivity of a second magnetic sense element of said sensor package to said external magnetic field; and
      communicating an output signal representative of said external magnetic field from said high field magnetic sense element to a processor within said sensor package;
   determining, at said processor, when a reset action is needed in response to said altered magnetic state, wherein said processor determines that said reset action is needed when said external magnetic field exceeds a maximum magnetic field threshold; and
   applying a reset magnetic field to said ferromagnetic structure via a current carrying structure positioned in proximity to said ferromagnetic structure to reset said ferromagnetic structure to said baseline magnetic state.

2. The method of claim 1 wherein said high field magnetic sense element has a sensitivity corresponding to an expected magnitude of a magnetic shock event.

3. The method of claim 1 further comprising:
   producing, at said processor, a reset trigger signal when said reset action is needed; and
   receiving, at said current carrying structure, a reset current pulse in response to said reset trigger signal, said reset current pulse generating said reset magnetic field.

4. The method of claim 1 further comprising receiving, at said current carrying structure, a reset current pulse in response to a reset trigger signal produced from a source external to said sensor package, said reset current pulse generating said reset magnetic field.

5. The method of claim 1 wherein said ferromagnetic structure comprises a flux concentrator, and said applying operation applies said reset magnetic field to said flux concentrator, said reset magnetic field having a magnetic flux density magnitude that is sufficient to reset a magnetic polarization of said flux concentrator.

6. In a sensor package having a ferromagnetic structure, said ferromagnetic structure being characterized by a baseline magnetic state, a method comprising:
   detecting an altered magnetic state of said ferromagnetic structure, said altered magnetic state differing from said baseline magnetic state, wherein said detecting comprises receiving, at a processor within said sensor package, an output signal from a magnetic sense element of said sensor package;
   determining, at said processor, when a reset action is needed in response to said altered magnetic state, wherein said determining comprises ascertaining, at said processor, that said output signal includes a noise component that exceeds a minimum noise level threshold for said magnetic sense element, wherein said processor determines that said reset action is needed when said noise component exceeds said minimum noise level threshold; and
   applying a reset magnetic field to said ferromagnetic structure via a current carrying structure positioned in proximity to said ferromagnetic structure to reset said ferromagnetic structure to said baseline magnetic state.

7. In a sensor package having a ferromagnetic structure, said ferromagnetic structure being characterized by a baseline magnetic state, a method comprising:
   detecting an altered magnetic state of said ferromagnetic structure, said altered magnetic state differing from said baseline magnetic state, wherein said detecting comprises:
      detecting a magnetic state of said ferromagnetic structure at a magnetic state sensor of a subsystem included in said sensor package, wherein a difference in magnetic polarization between said magnetic state sensor and a reference magnetic state sensor provides an indication of said altered magnetic state of said ferromagnetic structure; and
      communicating a state signal representative of said difference in magnetic polarization to a processor within said sensor package;
   determining, at said processor, when a reset action is needed in response to said altered magnetic state, wherein said processor determines that said reset action is needed when said difference exceeds a predetermined threshold value; and
   applying a reset magnetic field to said ferromagnetic structure via a current carrying structure positioned in proximity to said ferromagnetic structure to reset said ferromagnetic structure to said baseline magnetic state.

8. In a sensor package having a first ferromagnetic structure, said first ferromagnetic structure being characterized by a baseline magnetic state, a subsystem included in said sensor package has a second ferromagnetic structure, a magnetic state sensor in proximity to said second ferromagnetic structure, and a reference magnetic state sensor, a method comprising:
   detecting an altered magnetic state of said first ferromagnetic structure, said altered magnetic state differing from said baseline magnetic state, said detecting comprising:
      detecting a magnetic state of said second ferromagnetic structure, wherein a difference in magnetic polarization between said magnetic state sensor and said reference magnetic state sensor provides an indication of said magnetic state of said second ferromagnetic structure, said magnetic state of said second ferromagnetic structure being indicative of said altered magnetic state of said first ferromagnetic structure; and communicating a state signal representative of said magnetic state of said second ferromagnetic structure to a processor within said sensor package;

determining, at said processor, when a reset action is needed in response to said altered magnetic state, wherein said processor determines that said reset action is needed when said difference exceeds a predetermined threshold value; and applying a reset magnetic field to said first ferromagnetic structure via a current carrying structure positioned in proximity to said first ferromagnetic structure to reset said first ferromagnetic structure to said baseline magnetic state.

9. A sensor package comprising:

a magnetic field sensor, said magnetic field sensor including a magnetic sense element and a ferromagnetic structure proximate said magnetic sense element, said ferromagnetic structure being characterized by a baseline magnetic state; and a subsystem incorporated in said sensor package, said subsystem comprising:

a detector element configured to detect an altered magnetic state of said ferromagnetic structure, said altered magnetic state differing from said baseline magnetic state;

a processor configured to determine when a reset action is needed in response to said altered magnetic state, wherein said processor includes said detector element, said detector element receiving an output signal of said magnetic sense element of said magnetic field sensor, and said processor ascertains that said output signal includes a noise component and determines that said reset action is needed when said noise component exceeds a minimum noise level threshold; and a current carrying structure positioned in proximity to said ferromagnetic structure, said current carrying structure being utilized to apply a reset magnetic field to said ferromagnetic structure to reset said ferromagnetic structure to said baseline magnetic state.

10. The sensor package of claim 9 wherein:

said processor is configured to produce a reset trigger signal when said reset action is needed; and said current carrying structure is configured to receive a reset current pulse in response to said reset trigger signal, said reset current pulse generating said reset magnetic field.

11. The sensor package of claim 9 wherein said ferromagnetic structure comprises a flux concentrator, and said reset magnetic field is applied to said flux concentrator, said reset magnetic field having a magnetic flux density magnitude that is sufficient to reset a magnetic polarization of said flux concentrator.

12. A sensor package comprising:

a magnetic field sensor, said magnetic field sensor including a magnetic sense element and a ferromagnetic structure proximate said magnetic sense element, said ferromagnetic structure being characterized by a baseline magnetic state; and a subsystem incorporated in said sensor package, said subsystem comprising:

a detector element configured to detect an altered magnetic state of said ferromagnetic structure, said altered magnetic state differing from said baseline magnetic state, said detector element comprising a high field magnetic sense element configured to detect an external magnetic field and communicate an output signal representative of said external magnetic field to said processor, wherein said high field magnetic sense element exhibits a first sensitivity to said external magnetic field that is less than a second sensitivity of said magnetic sense element of said magnetic field sensor to said external magnetic field;

a processor configured to determine when a reset action is needed in response to said altered magnetic state, said processor determining that said reset action is needed when said external magnetic field exceeds a maximum magnetic field threshold; and a current carrying structure positioned in proximity to said ferromagnetic structure, said current carrying structure being utilized to apply a reset magnetic field to said ferromagnetic structure to reset said ferromagnetic structure to said baseline magnetic state.

13. The sensor package of claim 12 wherein said high field magnetic sense element has a sensitivity corresponding to an expected magnitude of a magnetic shock event.

14. A sensor package comprising:

a magnetic field sensor, said magnetic field sensor including a magnetic sense element and a ferromagnetic structure proximate said magnetic sense element, said ferromagnetic structure being characterized by a baseline magnetic state; and a subsystem incorporated in said sensor package, said subsystem comprising:

a detector element configured to detect an altered magnetic state of said ferromagnetic structure, said altered magnetic state differing from said baseline magnetic state;

a processor configured to determine when a reset action is needed in response to said altered magnetic state; and a current carrying structure positioned in proximity to said ferromagnetic structure, said current carrying structure being utilized to apply a reset magnetic field to said ferromagnetic structure to reset said ferromagnetic structure to said baseline magnetic state, wherein said detector element comprises:

a magnetic state sensor configured to detect a magnetic state of said ferromagnetic structure; and a reference magnetic state sensor, wherein a difference in magnetic polarization between said magnetic state sensor and said reference magnetic state sensor provides an indication of said altered magnetic state of said ferromagnetic structure, and said detector element is adapted to communicate a state signal representative of said magnetic state to said processor, wherein said processor determines that said reset action is needed when said difference exceeds a predetermined threshold value.

15. The sensor package of claim 14 wherein:

said processor is configured to produce a reset trigger signal when said reset action is needed; and said current carrying structure is configured to receive a reset current pulse in response to said reset trigger signal, said reset current pulse generating said reset magnetic field.

16. The sensor package of claim 14 wherein said ferromagnetic structure comprises a flux concentrator, and said reset magnetic field is applied to said flux concentrator, said reset magnetic field having a magnetic flux density magnitude that is sufficient to reset a magnetic polarization of said flux concentrator.

17. A sensor package comprising:
a magnetic field sensor, said magnetic field sensor including a magnetic sense element and a first ferromagnetic structure proximate said magnetic sense element, said first ferromagnetic structure being characterized by a baseline magnetic state; and
a subsystem incorporated in said sensor package, said subsystem comprising:
a detector element configured to detect an altered magnetic state of said ferromagnetic structure, said altered magnetic state differing from said baseline magnetic state;
a processor configured to determine when a reset action is needed in response to said altered magnetic state; and
a current carrying structure positioned in proximity to said ferromagnetic structure, said current carrying structure being utilized to apply a reset magnetic field to said ferromagnetic structure to reset said ferromagnetic structure to said baseline magnetic state, wherein said detector element comprises:
a second ferromagnetic structure;
a magnetic state sensor configured to detect a magnetic state of said second ferromagnetic structure; and
a reference magnetic state sensor, wherein a difference in magnetic polarization between said magnetic state sensor and said reference magnetic state sensor provides an indication of said magnetic state of said second ferromagnetic structure, said magnetic state
of said second ferromagnetic structure being indicative of said altered magnetic state of said first ferromagnetic structure, and said detector element is adapted to communicate a state signal representative of said magnetic state to said processor, wherein said processor determines that said reset action is needed when said difference exceeds a predetermined threshold value.

18. The sensor package of claim 17 wherein:
said processor is configured to produce a reset trigger signal when said reset action is needed; and
said current carrying structure is configured to receive a reset current pulse in response to said reset trigger signal, said reset current pulse generating said reset magnetic field.

19. The sensor package of claim 17 wherein said first ferromagnetic structure comprises a flux concentrator, and said reset magnetic field is applied to said flux concentrator, said reset magnetic field having a magnetic flux density magnitude that is sufficient to reset a magnetic polarization of said flux concentrator.

* * * * *